United States Patent [19]

Takaya

[11] 4,439,640

[45] Mar. 27, 1984

[54] PIEZOELECTRIC LOUDSPEAKER

[75] Inventor: Tadashi Takaya, Kanazawa, Japan

[73] Assignee: Murata Manufacturing Co., Ltd., Japan

[21] Appl. No.: 336,038

[22] Filed: Dec. 31, 1981

[30] Foreign Application Priority Data

Jan. 5, 1981 [JP] Japan .................................... 56-626

[51] Int. Cl.$^3$ .............................................. H01L 41/08

[52] U.S. Cl. ................................. 179/110 A; 310/321

[58] Field of Search ........... 179/110 A, 110 R, 181 R; 310/321, 323, 324, 325

[56] References Cited

U.S. PATENT DOCUMENTS 4,368,401 1/1983 Martin ........................... 179/110 A

FOREIGN PATENT DOCUMENTS 3005708 8/1981 Fed. Rep. of Germany ... 179/110 A

*Primary Examiner*—G. Z. Rubinson

*Assistant Examiner*—L. C. Schroeder

*Attorney, Agent, or Firm*—Ostrolenk, Faber, Gerb & Soffen

[57] ABSTRACT

A piezoelectric loudspeaker thin plate-like shaped and using a piezoelectric ceramic plate for a sound-generating portion, which comprises a disc-shaped diaphragm formed of a metallic plate, a disc-shaped film using a material of a smaller Q-factor and formed about equal in diameter to the disc-shaped diaphragm, and a disc-shaped piezoelectric ceramic plate smaller in diameter than the disc-shaped diaphragm, these three members being stuck concentrically with each other, so that the integral-stuck member is supported at its outer peripheral portion to a frame.

6 Claims, 3 Drawing Figures

PIEZOELECTRIC LOUDSPEAKER

This invention relates to a piezoelectric loudspeaker of a thin plate-like shape, which uses a piezoelectric ceramic plate for a sound-generating portion to thereby utilize the piezoelectric effect.

BACKGROUND OF THE INVENTION

Generally, electronic apparatus, such as a radio or a voice composite instrument, provided with loudspeakers use an inner-housed moving-coil speaker because of its superior frequency characteristic.

It has recently become desirable to make electronic apparatus having the above loudspeaker thinner.

Since it is structurally difficult, however, to make the moving-coil speaker, made thinner, it has been difficult to make the electronic apparatus thinner for this reason, a loudspeaker of a piezoelectric-driven type instead of the moving-coil loudspeaker has been drawing public attention.

A conventional piezoelectric loudspeaker meeting this requirement has been proposed, which, as shown in FIG. 1, comprises a diaphragm 12 stretched across a frame 11 and a sound-generator which comprises a metallic plate 13 and a piezoelectric ceramic plate 14 adhered thereto to form a piezoelectric unimorph structure, the sound generator being bound to the diaphragm 12.

A loudspeaker constructed in this manner places the sound-generator 15 in approximately a free vibration condition despite the fact that it is adhered to the diaphragm 12. As a result, the Q-factor of sharpness of resonance at the resonance point is relatively large and the frequency characteristic is far from flat as shown by the curve A in FIG. 3. This is undesirous for the loudspeaker.

Also, it is troublesome to adhere the sound-generator of unimorph structure to the diaphragm stretched across the frame, which makes mass production difficult.

In order to solve the above problem, a sound-generator of unimorph structure, which flexibly vibrates in the bending mode and is supported circumferentially directly by the frame without using the diaphragm, has also proposed.

Such construction has a good characteristic for a buzzer, but is as a loudspeaker because its characteristics are not satisfactory to cover a voice band.

SUMMARY OF THE INVENTION

In the light of the above problems, the present invention has been designed. To this end, a disc-shaped diaphragm using a metallic plate, a disc-shaped film using a material of a smaller Q-factor than and about equal diameter to the disc-shaped diaphragm, and a piezoelectric ceramic plate smaller in diameter than the disc-shaped diaphragm, are stuck with each other into an integral-stuck member having at the outside the piezoelectric ceramic plate, the integral-stuck member being stretched on a frame.

A first object of the invention is to provide a piezoelectric loudspeaker capable of obtaining a fully flat frequency characteristic for the loudspeaker.

A second object of the invention is to provide a piezoelectric loudspeaker which is practicable for electronic apparatus, so that the electronic apparatus smaller in thickness can be realized.

A third object of the invention is to provide a piezoelectric loudspeaker which need not stick a sound-generator to a diaphragm stretched on a frame, thereby enabling mass production of loudspeakers.

Further objects and advantages of the present invention will be apparent from the following description, reference being had to the accompanying drawings wherein a preferred form of the present invention is clearly shown.

DETAILED DESCRIPTION OF THE INVENTION

Figure 1:
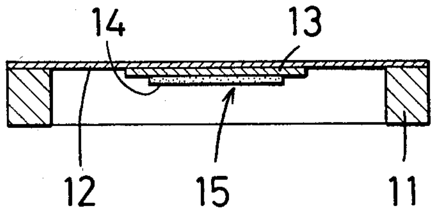
FIG. 1 PRIOR ART
FIG. 1 is a longitudinal sectional view of a conventional piezoelectric loudspeaker.
Figure 2:
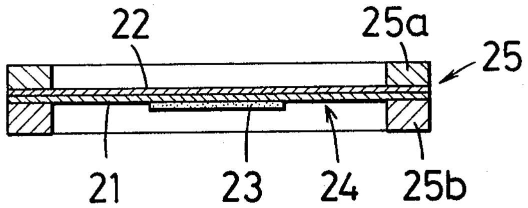
FIG. 2 is a longitudinal sectional view of a piezoelectric loudspeaker of the invention.

Referring to FIG. 2, a piezoelectric loudspeaker of the invention comprises an integral-vibrating member 24 comprising a disc-shaped diaphragm 21, a disc-shaped film 22, and a piezoelectric ceramic plate 23, which are adhered in layers, and a frame 25 onto which the integral-vibrating member 24 is stretched.

The disc-shaped diaphragm 21 is formed of a metallic plate, such as a brass sheet, and the disc-shaped film 22 is formed of a material, such as paper or a polyethylene film, and has a smaller Q-factor than and is approximately equal in diameter to the disc-shaped diaphragm 21.

The disc-shaped film 22 also is coated throughout one side by an adhesive and is adhered concentrically to the diaphragm 21.

The piezoelectric ceramic plate 23 is formed of piezoelectric ceramics (PZT) or the like, is disc-shaped and is smaller in diameter than the disc-shaped diaphragm 21 and disc-shaped film 22. The plate 21 has electrodes (not shown) provided at opposite sides thereof.

The piezoelectric ceramic plate 23 is concentrically adhered to one side of disc-shaped diaphragm 21, the remaining side of the disc-shaped diaphragm being adhered to the disc-shaped film 22. A first lead wire (not shown) is connect to the outside electrode of the piezoelectric ceramic plate 23 and a second lead wire (not shown) is connected to the disc-shaped diaphragm 21.

The integral-vibrating member 24 comprising the diaphragm 21, film 22, and piezoelectric ceramic plate 23, formed in layers, is fixedly sandwiched between the outer peripheral portions of a pair of opposite frame members **25*a* and 25*b* and stretched concentrically with respect to the frame 25**.

Alternatively, the piezoelectric ceramic plate 23 may be adhered to the disc-shaped film 22. In this instance, the electrode of piezoelectric ceramic plate 23 at the disc-shaped film 22 side is bent outwardly, and the bent electrode and the electrode at the outside of piezoelectric ceramic plate are connected to respective lead wires.

Figure 3:
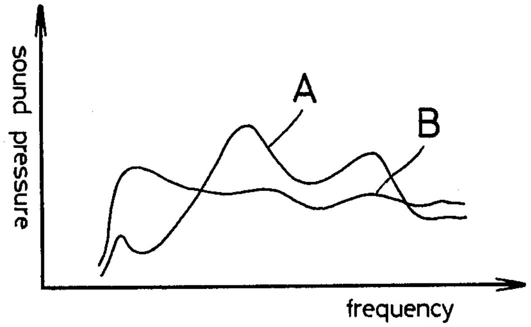
FIG. 3 is a graph showing the frequency characteristics based on the loudspeaker of the invention and conventional one.

When a signal is applied to the piezoelectric loudspeaker through the lead wires, the integral-vibrating member 24 vibrates in the vibrational mode of circumferential support, thereby obtaining the frequency characteristic shown by the curve B in FIG. 3.

As seen from the characteristic B, the piezoelectric loudspeaker has a sound pressure level of a substantially flat form, which level is generated even in the low frequency band.

Hence, the present invention exhibits a frequency characteristic which is flatter than the characteristic of the conventional piezoelectric loudspeaker shown by the curve A of FIG. 3, and this characteristic is obtainable throughout a wider frequency range.

To manufacture the piezoelectric loudspeaker of the invention, a metallic plate of a hoop-like shape and a low Q-factor film of the same shape are adhered to each other in layers. A disc-shaped piezoelectric ceramic plate is then adhered to the layered member. The metallic plate is thereafter cut to a given diameter to be mounted on the frame, thus remarkably improving the mass-productivity.

Alternatively, the disc-shaped diaphragm 21 adhered to the disc-shaped piezoelectric ceramic plate 23 in unimorph structure may be adhered to the disc-shaped film 22 to thereby produce the piezoelectric ceramic loudspeaker.

As seen from the above, the piezoelectric loudspeaker of the present invention comprises the integral-vibrating member stretched on the frame, the integral-vibrating member comprising the disc-shaped metallic diaphragm, the disc-shaped film having a smaller Q-factor than and equal diameter to the diaphragm, and disc-shaped piezoelectric ceramic plate smaller in diameter than the diaphragm, all adhered concentrically to each other and in layers to place the piezoelectric ceramic plate at the outermost side. Hence, the loudspeaker of the invention can obtain a flat frequency characteristic throughout a wide voice frequency zone including the low frequency zone and generate a clear voice or music, whereby the electronic apparatus using the loudspeaker and made smaller in thickness can be materialized.

Also, the integral-vibrating member stretched on the frame is easy to produce and mass-producible.

While an embodiment of the invention has been shown and described, the invention is not limited to the specific construction thereof which is merely exemplary in the specification rather than defined.

What is claimed is:

1. A piezoelectric loudspeaker comprising:

a disc-shaped diaphragm formed of a metallic plate;

a disc-shaped film formed of a material having a smaller Q-factor than and substantially equal in diameter to said diaphragm; and a disc-shaped piezoelectric ceramic plate smaller in diameter than said diaphragm;

said diaphragm, said film and said piezoelectric ceramic plate being adhered concentrically to each other so as to form an integral member with said piezoelectric ceramic plate located on the outside of said integral member; said integral member being supported at the outer peripheral portion thereof to a frame.

2. A piezoelectric loudspeaker according to claim 1, wherein said disc-shaped diaphragm is formed of a thin brass plate.

3. A piezoelectric loudspeaker according to claim 1, wherein said disc-shaped film is formed of paper, polyethylene, or the like.

4. A piezoelectric loudspeaker according to claim 1, wherein said piezoelectric ceramic plate is adhered to said disc-shaped diaphragm.

5. A piezoelectric loudspeaker according to claim 1, wherein said piezoelectric ceramic plate is adhered to said disc-shaped film.

6. A piezoelectric loudspeaker according to claim 1, wherein said frame comprises a pair of annular frame members, said frame members sandwiching therebetween the outer peripheral portion of said integral member.

* * * * *